(12) United States Patent
Yoo et al.

(10) Patent No.: US 6,933,529 B2
(45) Date of Patent: Aug. 23, 2005

(54) ACTIVE MATRIX TYPE ORGANIC LIGHT EMITTING DIODE DEVICE AND THIN FILM TRANSISTOR THEREOF

(75) Inventors: Juhn-Suk Yoo, Seoul (KR); Jae-Yong Park, Kyonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/609,024

(22) Filed: Jun. 30, 2003

(65) Prior Publication Data

US 2004/0142502 A1 Jul. 22, 2004

(30) Foreign Application Priority Data

Jul. 11, 2002 (KR) .................. 10-2002-0040409

(51) Int. Cl.[7] .................. H01L 29/04; H01L 21/00
(52) U.S. Cl. .................. 257/59; 257/72; 257/113; 257/184; 257/228; 438/24; 438/46; 438/69; 438/82; 438/99
(58) Field of Search .................. 438/24, 46, 69, 438/82, 99, 48; 257/290, 72, 59, 113, 184, 228

(56) References Cited

U.S. PATENT DOCUMENTS

| | | | |
|---|---|---|---|
| 5,661,050 A | 8/1997 | den Boer et al. ............. | 438/30 |
| 6,088,072 A * | 7/2000 | Lee .............................. | 349/39 |
| 6,204,535 B1 | 3/2001 | Yamazaki et al. ........... | 257/353 |
| 6,307,322 B1 | 10/2001 | Dawson et al. | |
| 6,310,668 B1 | 10/2001 | Ukita ........................... | 349/42 |
| 6,509,591 B2 | 1/2003 | Pang .......................... | 257/291 |
| 2004/0009627 A1 * | 1/2004 | Lee et al. .................... | 438/99 |

FOREIGN PATENT DOCUMENTS

| | | |
|---|---|---|
| EP | 0 694 804 | 1/1996 |
| EP | 1 005 094 | 5/2000 |
| EP | 1 124 261 | 8/2001 |
| EP | 1 326 281 | 7/2003 |
| JP | 11-38445 | 2/1999 |
| JP | 2001-308333 | 11/2000 |
| JP | 2001-215529 | 8/2001 |
| JP | 2003-149681 | 5/2003 |
| WO | WO 03/050892 | 6/2003 |

* cited by examiner

Primary Examiner—Hsien-Ming Lee
(74) Attorney, Agent, or Firm—Morgan, Lewis & Bockius LLP

(57) ABSTRACT

An active matrix type organic light emitting diode device and a thin film transistor thereof are disclosed in the present invention. The driving thin film transistor for an active matrix type organic light emitting diode (AMOLED) device having first and second electrodes spaced apart from each other and an organic light emitting layer disposed between the first and second electrodes includes a gate electrode on a substrate, a semiconductor layer over the gate electrode, and source and drain electrodes on the semiconductor layer, wherein the source and drain electrodes are spaced apart from each other and respectively overlap portions of the gate electrode, and an overlapping area between the gate electrode and the source electrode is larger than an overlapping area between the gate electrode and the drain electrode.

20 Claims, 6 Drawing Sheets

ACTIVE MATRIX TYPE ORGANIC LIGHT EMITTING DIODE DEVICE AND THIN FILM TRANSISTOR THEREOF

This application claims the benefit of the Korean Application No. P2002-040409 filed on Jul. 11, 2002, which is hereby incorporated by reference.

BACKGROUND OF THE INVENTION

1. Field of the Invention

The present invention relates to an organic light emitting diode (OLED), and more particularly, to an active matrix type organic light emitting diode (AMOLED) device and a thin film transistor thereof.

2. Discussion of the Related Art

Liquid crystal display (LCD) devices have been most widely used in the field for flat panel display devices due to their lightweight and low power consumption. However, the liquid crystal display (LCD) device is not a light emitting element but a light receiving element that needs an additional light source to display images. Thus, there have existed technical limitations in improving brightness, contrast ratio, viewing angle, and enlarging the size of a liquid crystal display panel. For these reasons, many researches have been in active progress in the field to develop a new flat panel display element that can overcome the aforementioned problems. The organic light emitting diode (OLED) device is one of the new flat panel display elements. Because the organic light emitting diode (OLED) device emits light without an additional light source, the viewing angle and the contrast ratio are superior to the liquid crystal display (LCD) device. In addition, because it does not need a backlight as the light source, it has advantages such as lightweight, small dimension, and low power consumption. Moreover, the organic light emitting diode (OLED) device can be driven with a low DC (direct current) and has a fast response time. Since the organic light emitting diode (OLED) device uses solid material instead of fluid material, such as liquid crystal, it is more stable under the external impact and has a wider range of temperature conditions under which the organic light emitting diode (OLED) device can be operated, as compared to the liquid crystal display (LCD) device. Specifically, the organic light emitting diode (OLED) device is advantageous in that the production cost is low. Specifically, because a deposition apparatus and an encapsulation apparatus are the only apparatuses required for manufacturing the organic light emitting diode (OLED) device, as opposed to the liquid crystal display (LCD) device or plasma display panels (PDPS) needing many other apparatuses, the manufacturing process for the organic light emitting diode (OLED) device becomes very simple. If the organic light emitting diode (OLED) device is an active matrix type organic light emitting diode (AMOLED) device that has a thin film transistor as a switching element for each pixel, a desired luminance can be obtained by applying a low current. Accordingly, the organic light emitting diode (OLED) device is advantageous in terms of a low power consumption, a high resolution, and a large size. The basic structure and operation characteristics of the active matrix type organic light emitting diode (AMOLED) device will be described hereinafter with reference to FIG. 1.

FIG. 1 illustrates a structure of a pixel of a typical active matrix type organic light emitting diode (AMOLED) device according to the related art.

Referring to FIG. 1, a scanning line 1 is formed in the first direction, and signal and power supply lines 2 and 3 are formed in the second direction perpendicular to the first direction. The scanning line 1 and the signal and power supply lines 2 and 3 define a pixel region by crossing one another. A switching thin film transistor 4 functioning as an addressing element is formed at a portion adjacent to the intersection of the scanning line 1 and the signal line 2. A storage capacitor 6 is electrically connected to the switching thin film transistor 4 and the power supply line 3. A driving thin film transistor that functions as a current source element 5 is electrically connected to the storage capacitor 6 and the power supply line 3. An electro luminescent diode 7 is electrically connected to the driving thin film transistor 5. More specifically, the active matrix type organic light emitting diode (AMOLED) device has the switching thin film transistor 4 and the driving thin film transistor 5 in a pixel. The switching thin film transistor 4 is for addressing a pixel voltage, which is a gate driving voltage, and the driving thin film transistor 5 is for controlling a driving current of the active matrix type organic light emitting diode (AMOLED) device. In addition, the active matrix type organic light emitting diode (AMOLED) device requires the storage capacitor 6 to maintain a stable pixel voltage.

FIG. 2A illustrates a plane view of a thin film transistor for a typical inverted staggered type active matrix organic light emitting diode (AMOLED) device according to the related art.

Referring to FIG. 2A, a gate electrode 12 is formed in one direction, and a semiconductor layer 14 having an island pattern is formed to cover the gate electrode 12. Source and drain electrodes 16 and 18 are formed on the semiconductor layer 14 to respectively overlap portions of the gate electrode 12. The source electrode 16 is extended from the power supply line 20, which is formed in the same direction as the gate electrode 12. Although not shown in FIG. 2A, the drain electrode 18 is electrically connected to a first electrode (not shown) for the active matrix type organic light emitting diode (AMOLED) device, and the gate electrode 12 is electrically connected to a drain electrode (not shown) of the switching thin film transistor. Although not shown in FIG. 2A, the active matrix type organic light emitting diode (AMOLED) device has a storage capacitor (not shown) that is electrically connected to the power supply line and functions to stably maintain a pixel driving voltage for a period of time.

In the active matrix type organic light emitting diode (AMOLED) device according to the related art, the gate electrode 12 overlaps portions of the source and drain electrodes 16 and 18 keeping a spaced distance "d1" between the source and drain electrodes 16 and 18. A first overlapping portion "a" between the gate electrode 12 and the source electrode 16 is symmetrical with a second overlapping portion "b" between the gate electrode 12 and the drain electrode 18 with respect to the centerline of the gate electrode 12.

FIG. 2B illustrates a cross-sectional view taken along line IIB—IIB of FIG. 2A.

Referring to FIG. 2B, the gate electrode 12 is formed on a substrate 10, and a gate insulating layer 13 is formed on the entire substrate 10, on which the gate electrode 12 is already formed. The semiconductor layer 14 is formed on the gate insulating layer 13 to cover the gate electrode 12. The source and drain electrodes 16 and 18 are formed on the semiconductor layer 14 and spaced apart from each other. Parasitic capacitances $C_{gs}$ and $C_{gd}$ are generated in the first and second overlapping portions "a" and "b", respectively. The parasitic capacitances $C_{gs}$ and $C_{gd}$ have a same capacitance value. In the active matrix type organic light emitting diode (AMOLED) device according to the related art, the areas of the first and second overlapping portions "a" and "b" are minimized to reduce the parasitic capacitances $C_{gs}$ and $C_{gd}$. On the other hand, since a thin film transistor of the related art liquid crystal display (LCD) device only functions as a switching element and a data voltage is controlled depending on a common voltage, the switching thin film transistor generates a parasitic capacitance, and the parasitic capacitance induces a flicker phenomenon and a cross-talk phenomenon that deteriorate the quality of displayed images.

However, in the active matrix type organic light emitting diode (AMOLED) device, since a gray scale of an image must be displayed by controlling an amount of current in the driving thin film transistor, it is very important to keep a constant current to obtain a good quality of displayed images. More specifically, if the voltage cannot be stably maintained by the storage capacitor, a current level fluctuates greatly, and thus images having good picture quality cannot be displayed. Accordingly, the storage capacitor plays a very important role in the active matrix type organic light emitting diode (AMOLED) device. The active matrix type organic light emitting diode (AMOLED) device is a current modulation element, in which source and drain directions of a pixel voltage are already decided, and a polarity reversion from positive to negative, and vice versa, does not occur unlike in the liquid crystal display (LCD) device.

In spite of the above-described difference between the active matrix type organic light emitting diode (AMOLED) device and the liquid crystal display (LCD) device, an overlapping area between the gate electrode and the source electrode is formed to be the same as an overlapping area between the gate electrode and the drain electrode in the driving thin film transistor, such as in a switching thin film transistor. Thus, the amount of a pixel voltage depends on the size of an additional storage capacitor. Accordingly, a disconnection of the adjacent metal patterns may occur in a storage capacitor region, which then results in a product failure.

SUMMARY OF THE INVENTION

Accordingly, the present invention is directed to an active matrix type organic light emitting diode (AMOLED) device that substantially obviates one or more of problems due to limitations and disadvantages of the related art.

Another object of the present invention is to provide a driving thin film transistor for an active matrix type organic light emitting diode (AMOLED) device having a structure in which an overlapping area between a gate electrode and a source electrode is formed to be larger than an overlapping area between the gate electrode and a drain electrode, so that the overlapping area between the gate electrode and the source electrode forms a storage capacitor for driving a pixel.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a driving thin film transistor for an active matrix type organic light emitting diode (AMOLED) device having first and second electrodes spaced apart from each other and an organic light emitting layer disposed between the first and second electrodes includes a gate electrode on a substrate, a semiconductor layer over the gate electrode, and source and drain electrodes on the semiconductor layer, wherein the source and drain electrodes are spaced apart from each other and respectively overlap portions of the gate electrode, and an overlapping area between the gate electrode and the source electrode is larger than an overlapping area between the gate electrode and the drain electrode.

An insulating layer is disposed between the gate electrode and the semiconductor layer. The overlapping portion between the gate electrode and the source electrode forms a storage capacitor for driving a pixel. The semiconductor layer has an active layer and an ohmic contact layer, wherein the active layer is formed of amorphous silicon and the ohmic contact layer is formed of doped amorphous silicon. Herein, the ohmic contact layer has a portion exposing a part of the active layer.

In another aspect of the present invention, a method of fabricating a driving thin film transistor for an active matrix type organic light emitting diode (AMOLED) device having first and second electrodes spaced apart from each other and an organic light emitting layer disposed between the first and second electrodes, includes forming a gate electrode on a substrate, forming a semiconductor layer over the gate electrode, and forming source and drain electrodes on the semiconductor layer, wherein the source and drain electrodes are spaced apart from each other and respectively overlap portions of the gate electrode, and an overlapping area between the gate electrode and the source electrode is larger than an overlapping area between the gate electrode and the drain electrode.

In another aspect of the present invention, an active matrix type organic light emitting diode (AMOLED) device includes a gate electrode on a substrate, a gate insulating layer on the substrate including the gate electrode, a semiconductor layer on the gate insulating layer, source and drain electrodes on the semiconductor layer, wherein the source and drain electrodes are spaced apart from each other and respectively overlap portions of the gate electrode, a passivation layer on the substrate to cover the source and drain electrodes, the passivation layer having a drain contact hole to expose a portion of the drain electrode, a first electrode on the passivation layer, the first electrode being electrically connected to the drain electrode through the drain contact hole, an organic light emitting layer on the first electrode, and a second electrode on the organic light emitting layer, and an overlapping area between the gate electrode and the source electrode is larger than an overlapping area between the gate electrode and the drain electrode.

The overlapping portion between the gate electrode and the source electrode forms a storage capacitor for driving a pixel. The active matrix type organic light emitting diode (AMOLED) device further comprises a switching thin film transistor electrically connected to the gate electrode. The active matrix type organic light emitting diode (AMOLED) device may be either an upward emitting type active matrix organic light emitting diode (AMOLED) device or a downward emitting type active matrix organic light emitting diode (AMOLED) device.

In a further aspect of the present invention, a method of fabricating an active matrix type organic light emitting diode (AMOLED) device, including forming a gate electrode on a substrate, forming a gate insulating layer on the substrate including the gate electrode, forming a semiconductor layer on the gate insulating layer, forming source and drain electrodes on the semiconductor layer, wherein the source and drain electrodes are spaced apart from each other and respectively overlap portions of the gate electrode, forming a passivation layer on the substrate to cover the source and drain electrodes, the passivation layer having a drain contact hole to expose a portion of the drain electrode, forming a first electrode on the passivation layer, the first electrode being electrically connected to the drain electrode through the drain contact hole, forming an organic light emitting layer on the first electrode, and forming a second electrode on the organic light emitting layer, wherein an overlapping area between the gate electrode and the source electrode is larger than an overlapping area between the gate electrode and the drain electrode.

The overlapping portion between the gate electrode and the source electrode forms a storage capacitor for driving a pixel. The method of fabricating an active matrix type organic light emitting diode (AMOLED) device further comprises forming a switching thin film transistor electrically connected to the gate electrode. The active matrix type organic light emitting diode (AMOLED) device may be either an upward emitting type active matrix organic light emitting diode (AMOLED) device or a downward emitting type active matrix organic light emitting diode (AMOLED) device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 3A:
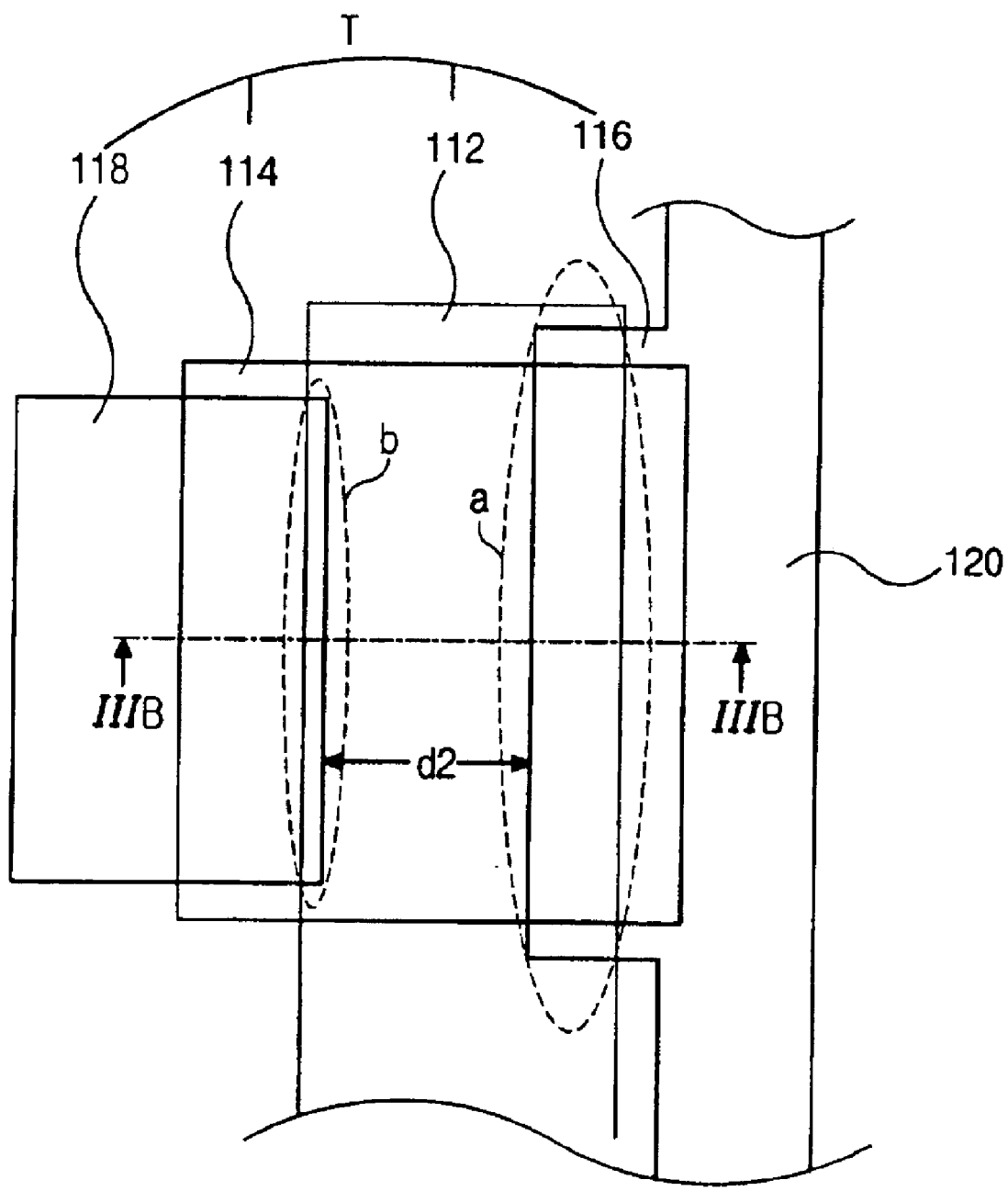
FIG. 3A illustrates a plane view of a driving thin film transistor for an inverted staggered type active matrix organic light emitting diode (AMOLED) device according to the present invention.

FIG. 3A illustrates a plane view of a driving thin film transistor for an inverted staggered type active matrix organic light emitting diode (AMOLED) device according to the present invention. For simplicity, FIG. 3A illustrates only a gate electrode, a semiconductor layer, a source electrode, and a drain electrode.

Figure 1:
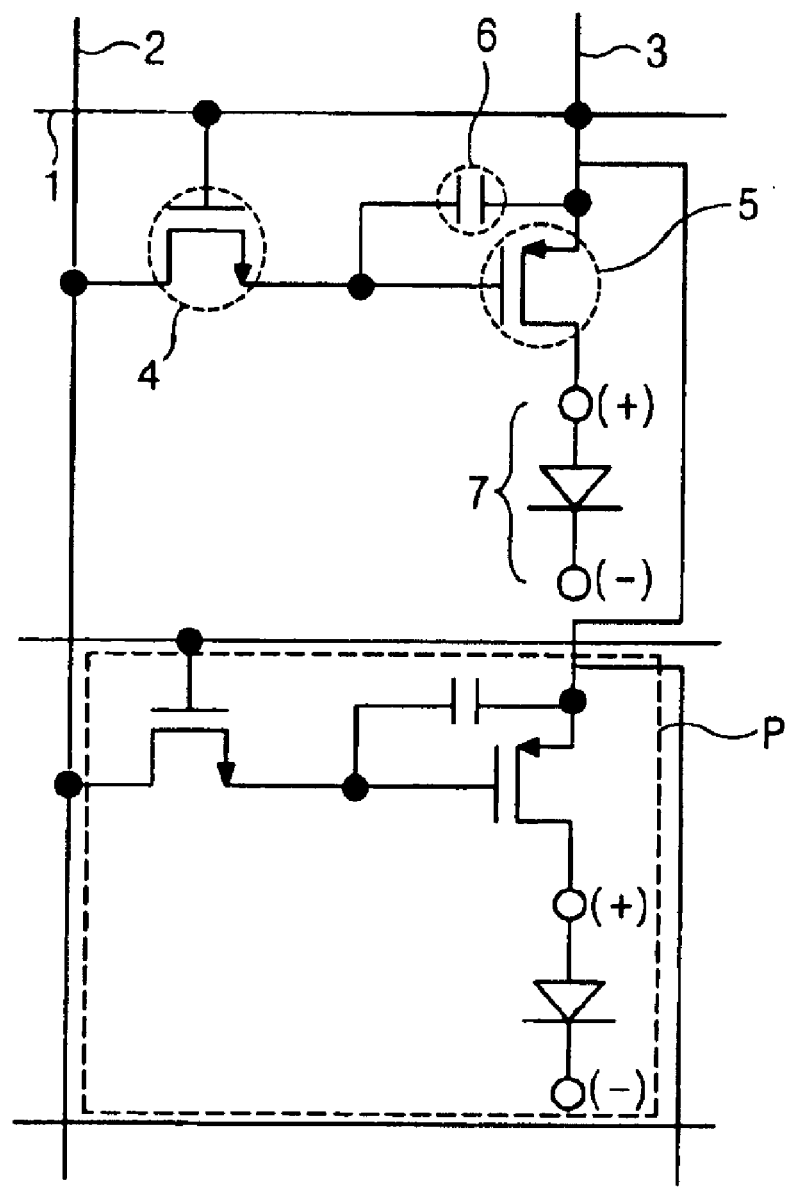
FIG. 1 illustrates a structure of a pixel of a typical active matrix type organic light emitting diode (AMOLED) device according to the related art.
Figure 2A:
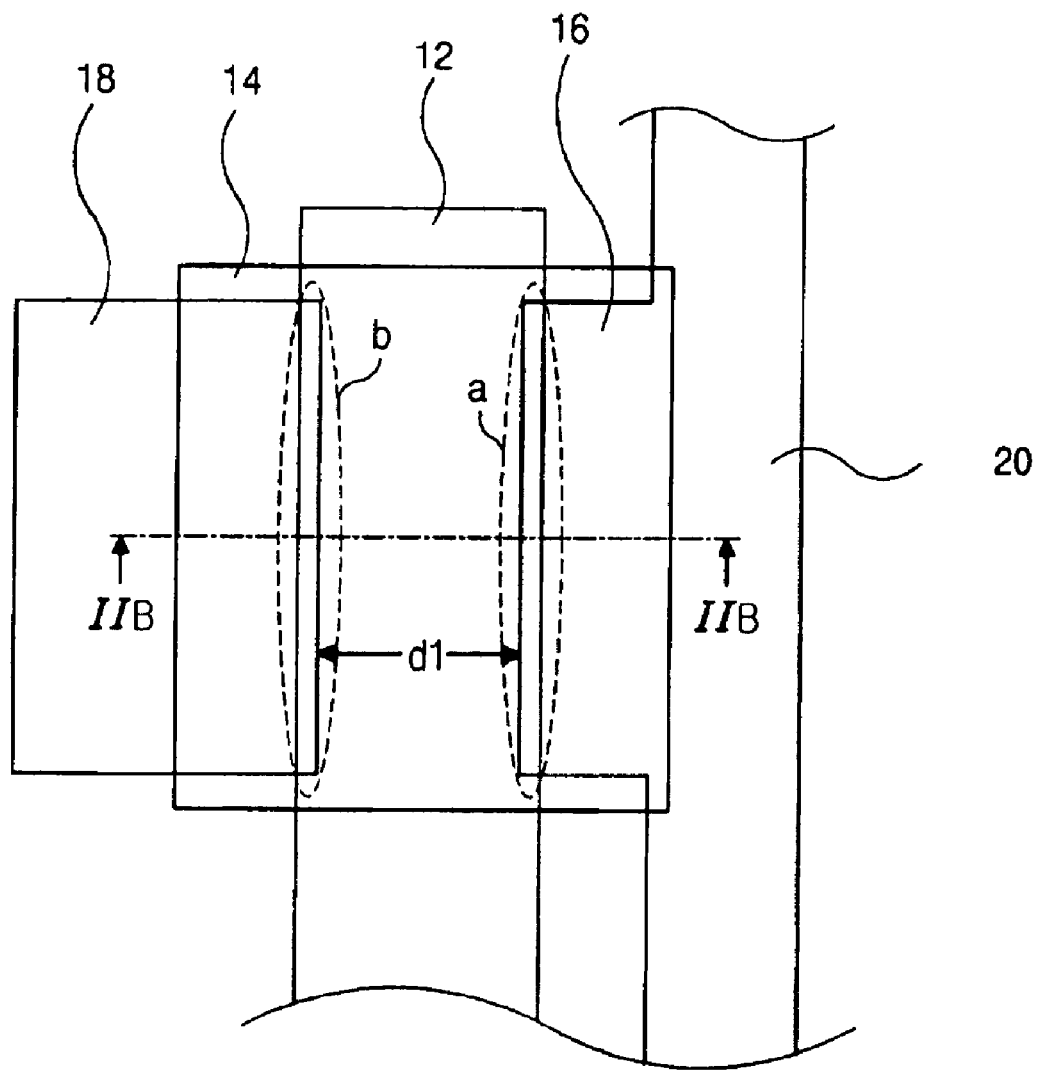
FIG. 2A illustrates a plane view of a thin film transistor for a typical inverted staggered type active matrix organic light emitting diode (AMOLED) device according to the related art.
Figure 2B:
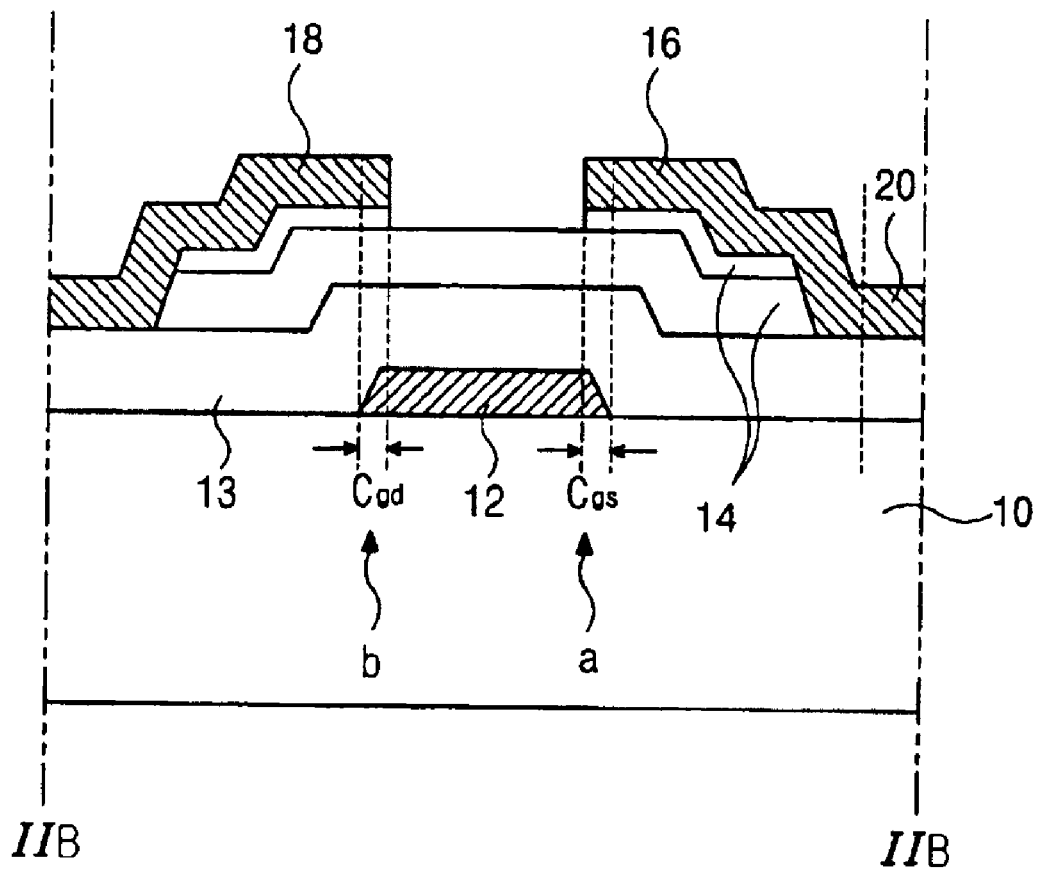
FIG. 2B illustrates a cross-sectional view taken along line IIB—IIB of FIG. 2A.

Referring FIG. 3A, a gate electrode 112 is formed in one direction, and a semiconductor layer 114 having an island pattern is formed over the gate electrode 112 to cover the gate electrode 112. Source and drain electrodes 116 and 118 are formed on the semiconductor layer 114 and spaced apart from each other. A power supply line 120 is formed in the same direction as the gate electrode 112. The source electrode 116 is extended from the power supply line 120. The gate electrode 112, the semiconductor layer 114, the source electrode 116, and the drain electrode 118 form a driving thin film transistor "T" for an active matrix type organic light emitting diode (AMOLED) device. An insulating layer (not shown in FIG. 3A) is disposed between the gate electrode 112 and the semiconductor layer 114, and the gate electrode 112 is electrically connected to a drain electrode of a switching thin film transistor (not shown). The drain electrode 118 for the driving thin film transistor "T" is electrically connected to a first electrode of the active matrix type organic light emitting diode (AMOLED) device. The gate electrode 112 and the source electrode 116 have a first overlapping portion "a", and the gate electrode 112 and the drain electrode 118 have a second overlapping portion "b". A spaced distance "d2" between the source electrode 116 and the drain electrode 118 corresponds to the spaced distance "d1" in FIG. 2A. An area of the first overlapping portion "a" is larger than that of the second overlapping portion "b". In the present invention, the area of the first overlapping portion "a" can be formed larger than that of the second overlapping portion "b" by extending a width of the gate electrode 112.

Figure 3B:
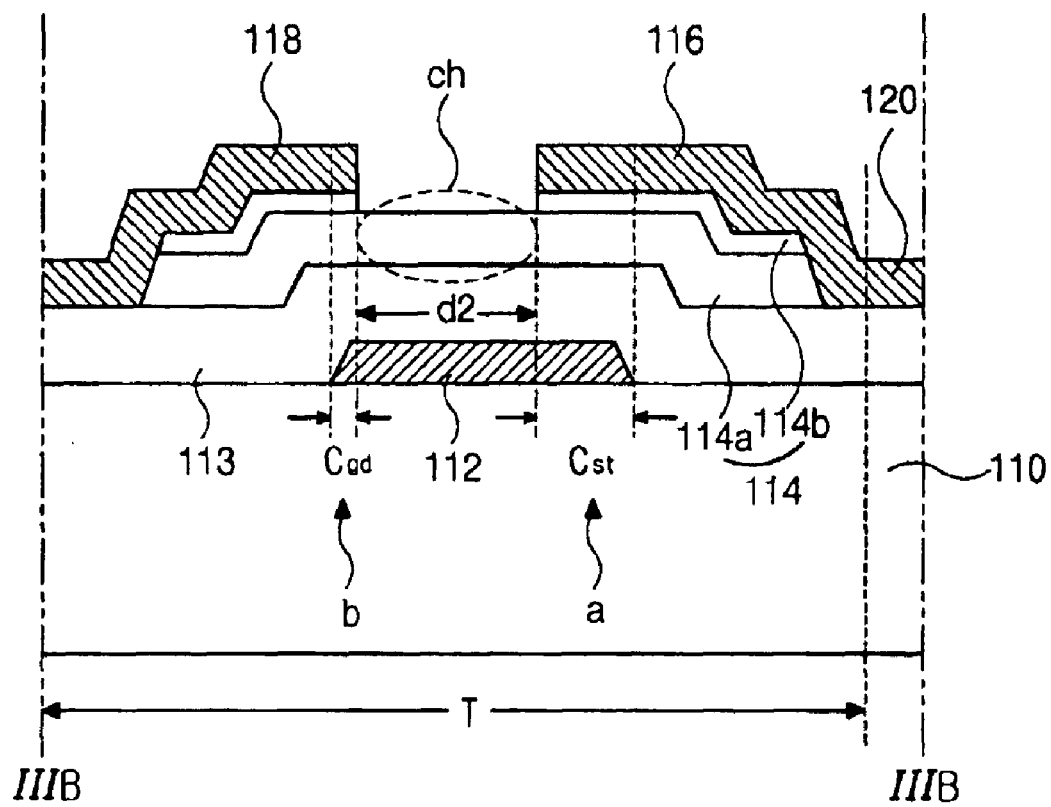
FIG. 3B illustrates a cross-sectional view taken along line IIIB—IIIB of FIG. 3A.

FIG. 3B illustrates a cross-sectional view taken along line IIIB—IIIB of FIG. 3A.

Referring to FIG. 3B, the gate electrode 112 is formed on a substrate 110, and a gate insulating layer 113 is formed on the entire substrate 110 on which the gate electrode 112 is already formed. The semiconductor layer 114 is formed on the gate insulating layer 113 corresponding to the gate electrode 112. The source and drain electrodes 116 and 118 are formed on the semiconductor layer 114 and spaced apart from each other. The semiconductor layer 114 has an active layer 114$a$ that is formed of amorphous silicon, and an ohmic contact layer 114$b$ formed of doped amorphous silicon. The ohmic contact layer 114$b$ exposes a portion of the active layer 114$a$ by removing a portion between the source and drain electrodes 116 and 118. The exposed portion of the active layer 114$a$ between the source and drain electrodes 116 and 118 forms a channel region "ch". As mentioned before, the spaced distance "d2" between the source and drain electrodes 116 and 118 corresponds to the spaced distance "d1" in FIG. 2A, and the area of the first overlapping portion "a" is larger than that of the second overlapping portion "b". As shown in FIG. 3B, one end of the gate electrode 112 is extended to the source electrode 116 to form the first overlapping portion "a" larger than the second overlapping portion "b". In the present invention, a parasitic capacitance that is generated between the gate electrode 112 and the source electrode 116 is used as a storage capacitance "$C_{st}$" by forming the first overlapping portion "a" larger than the second overlapping portion "b". On the other hand, a parasitic capacitance "$C_{gd}$" that is generated between the gate electrode 112 and the drain electrode 118 is minimized as in the related art active matrix type organic light emitting diode (AMOLED) device. Accordingly, if the first and second overlapping portions "a" and "b" are asymmetrically constructed, the area occupied by the storage capacitor may be reduced or an additional storage capacitor may be omitted. Thus, an aperture ratio can be increased. In addition, the disconnection of metal lines in a storage capacitor region can be avoided.

Figure 4:
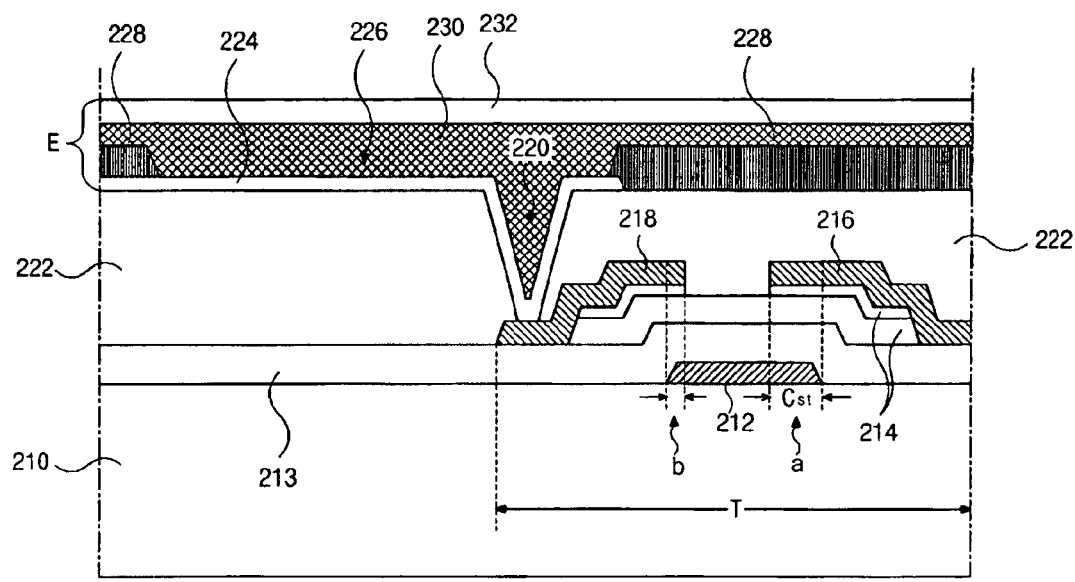
FIG. 4 illustrates a cross-sectional view of an active matrix type organic light emitting diode (AMOLED) device and a driving thin film transistor according to the present invention.

FIG. 4 illustrates a cross-sectional view of an active matrix type organic light emitting diode (AMOLED) device and a driving thin film transistor according to the present invention.

Referring to FIG. 4, a gate electrode 212 is formed on a substrate 210, and a gate insulating layer 213 covering the gate electrode 212 is formed on the entire substrate 210 on which the gate electrode 212 is already formed. A semiconductor layer 214 is formed on the gate insulating layer 213 corresponding to the gate electrode 212. Source and drain electrodes 216 and 218 are formed on the semiconductor layer 214 and spaced apart from each other. The gate electrode 212, the semiconductor layer 214, the source electrode 216, and the drain electrode 218 form a driving thin film transistor "T". A first passivation layer 222 is formed on the entire substrate 210 on which the driving thin film transistor "IT" is already formed, and a drain contact hole 220 exposing a portion of the drain electrode 218 is formed through the first passivation layer 222. A first electrode 224 is formed on the first passivation layer 222 and electrically connected to the drain electrode 218 through the drain contact hole 220. A second passivation layer 228 is formed on the entire substrate 210 on which the first electrode 224 is already formed. An open portion 226 exposing a portion of the first electrode 224 is formed through the second passivation layer 228. An organic light emitting layer 230 is formed on the second passivation layer 228 and connected to the first electrode 224 through the open portion 226 of the second passivation layer 228. A second electrode 232 is formed on the organic light emitting layer 230. The first and second electrodes 224 and 232 and the organic light emitting layer 230 form an organic light emitting diode (OLED). In the organic light emitting diode (OLED), the emitted light from the organic light emitting layer 230 is transmitted selectively through the first electrode 224 or the second electrode 232.

In the present invention, the first electrode 224 is a lower electrode, and the second electrode 232 is an upper electrode. The first electrode 224 is formed of a transparent material, so that light emits through the first electrode. Thus, the active matrix type organic light emitting diode (AMOLED) device becomes a downward emitting type active matrix organic light emitting diode (AMOLED) device. On the other hand, the second electrode 232 is formed of a transparent material, so that the light emits through the second electrode 232. Thus, the active matrix type organic light emitting diode (AMOLED) device becomes an upward emitting type active matrix organic light emitting diode (AMOLED) device.

As described herein, the first overlapping portion "a" between the gate electrode 212 and the source electrode 216 is formed wider than the second overlapping portion "b" between the gate electrode 212 and the drain electrode 218. Among parasitic capacitances that are formed between the gate electrode 212 and the source electrode 216 and between the gate electrode 212 and the drain electrode, the parasitic capacitance that is generated between the gate electrode 212 and the source electrode 216 is used as a storage capacitance for driving the pixel. The number of the thin film transistors in a pixel is two in the present invention, but the number of the thin film transistors in a pixel may vary, for example, to three or more than three.

The present invention has the following advantages. A quality of displayed images can be improved by increasing a storage capacitance of the pixel, and an aperture ratio can be increased by reducing the size of an additional storage capacitor or by omitting the additional storage capacitor. In addition, a disconnection of the metal lines such as a short-circuit in the storage capacitor region can be minimized.

It will be apparent to those skilled in the art that various modifications and variations can be made in the active matrix type organic light emitting diode (AMOLED) device and the thin film transistor thereof of the present invention without departing from the spirit or scope of the inventions. Thus, it is intended that the present invention covers the modifications and variations of this invention provided they come within the scope of the appended claims and their equivalents.

What is claimed is:

1. A driving thin film transistor for an active matrix type organic light emitting diode (AMOLED) device having first and second electrodes spaced apart from each other and an organic light emitting layer disposed between the first and second electrodes, comprising:

a gate electrode on a substrate;

a semiconductor layer over the gate electrode; and source and drain electrodes on the semiconductor layer, wherein the source and drain electrodes are spaced apart from each other and respectively overlap portions of the gate electrode, an overlapping area between the gate electrode and the source electrode is larger than an overlapping area between the gate electrode and the drain electrode, and the overlapping area between the gate electrode and the source electrode forms a storage capacitor for driving a pixel.

2. The driving thin film transistor according to claim 1, further comprising an insulating layer between the gate electrode and the semiconductor layer.

3. The driving thin film transistor according to claim 1, wherein the semiconductor layer has an active layer and an ohmic contact layer.

4. The driving thin film transistor according to claim 3, wherein the active layer is formed of amorphous silicon, and the ohmic contact layer is formed of doped amorphous silicon.

5. The driving thin film transistor according to claim 3, wherein the ohmic contact layer has a portion exposing a part of the active layer.

6. A method of fabricating a driving thin film transistor for an active matrix type organic light emitting diode (AMOLED) device having first and second electrodes spaced apart from each other and an organic light emitting layer disposed between the first and second electrodes, comprising:

forming a gate electrode on a substrate;

forming a semiconductor layer over the gate electrode; and forming source and drain electrodes on the semiconductor layer, wherein the source and drain electrodes are spaced apart from each other and respectively overlap portions of the gate electrode, an overlapping area between the gate electrode and the source electrode is larger than an overlapping area between the gate electrode and the drain electrode, and the overlapping area between the gate electrode and the source electrode forms a storage capacitor for a driving pixel.

7. The method according to claim 6, further comprising forming an insulating layer between the gate electrode and the semiconductor layer.

8. The method according to claim 6, wherein the semiconductor layer has an active layer and an ohmic contact layer.

9. The method according to claim 8, wherein the active layer is formed of amorphous silicon, and the ohmic contact layer is formed of doped amorphous silicon.

10. The method of claim 8, wherein the ohmic contact layer has a portion exposing a part of the active layer.

11. An active matrix type organic light emitting diode (AMOLED) device, comprising:
  a gate electrode on a substrate;
  a gate insulating layer on the substrate including the gate electrode;
  a semiconductor layer on the gate insulating layer;
  source and drain electrodes on the semiconductor layer, wherein the source and drain electrodes are spaced apart from each other and respectively overlap portions of the gate electrode;
  a passivation layer on the substrate to cover the source and drain electrodes, the passivation layer having a drain contact hole to expose a portion of the drain electrode;
  a first electrode on the passivation layer, the first electrode being electrically connected to the drain electrode through the drain contact hole;
  an organic light emitting layer on the first electrode; and
  a second electrode on the organic light emitting layer, wherein an overlapping area between the gate electrode and the source electrode is larger than an overlapping area between the gate electrode and the drain electrode.

12. The device according to claim 11, wherein the overlapping area between the gate electrode and the source electrode forms a storage capacitor for driving a pixel.

13. The device according to claim 11, further comprising a switching thin film transistor electrically connected to the gate electrode.

14. The device according to claim 11, wherein the active matrix type organic light emitting diode (AMOLED) device is an upward emitting type active matrix organic light emitting diode (AMOLED) device.

15. The device according to claim 11, wherein the active matrix type organic light emitting diode (AMOLED) device is a downward emitting type active matrix organic light emitting diode (AMOLED) device.

16. A method of fabricating an active matrix type organic light emitting diode (AMOLED) device, comprising:
  forming a gate electrode on a substrate;
  forming a gate insulating layer on the substrate including the gate electrode;
  forming a semiconductor layer on the gate insulating layer;
  forming source and drain electrodes on the semiconductor layer, wherein the source and drain electrodes are spaced apart from each other and respectively overlap portions of the gate electrode;
  forming a passivation layer on the substrate to cover the source and drain electrodes, the passivation layer having a drain contact hole to expose a portion of the drain electrode;
  forming a first electrode on the passivation layer, the first electrode being electrically connected to the drain electrode through the drain contact hole;
  forming an organic light emitting layer on the first electrode; and
  forming a second electrode on the organic light emitting layer, wherein an overlapping area between the gate electrode and the source electrode is larger than an overlapping area between the gate electrode and the drain electrode.

17. The method according to claim 16, wherein the overlapping area between the gate electrode and the source electrode forms a storage capacitor for driving a pixel.

18. The method according to claim 16, further comprising forming a switching thin film transistor electrically connected to the gate electrode.

19. The method according to claim 16, wherein the active matrix type organic light emitting diode (AMOLED) device is an upward emitting type active matrix organic light emitting diode (AMOLED) device.

20. The method according to claim 16, wherein the active matrix type organic light emitting diode (AMOLED) device is a downward emitting type active matrix organic light emitting diode (AMOLED) device.

* * * * *